(12) United States Patent
Porco et al.

(10) Patent No.: US 7,486,939 B2
(45) Date of Patent: Feb. 3, 2009

(54) APPARATUS FOR REMOVING DISTORTIONS CREATED BY AN AMPLIFIER

(75) Inventors: Ronald L. Porco, Fort Worth, TX (US); Dale R. Anderson, Colleyville, TX (US)

(73) Assignee: Motorola, Inc., Schaumburg, IL (US)

( * ) Notice: Subject to any disclaimer, the term of this patent is extended or adjusted under 35 U.S.C. 154(b) by 528 days.

(21) Appl. No.: 11/157,766

(22) Filed: Jun. 21, 2005

(65) Prior Publication Data

US 2007/0010215 A1    Jan. 11, 2007

(51) Int. Cl.
- H04B 1/00 (2006.01)
- H04B 15/00 (2006.01)
- H04B 1/04 (2006.01)
- H04B 1/16 (2006.01)
- H03F 1/00 (2006.01)
- H04K 1/02 (2006.01)
- H04L 25/03 (2006.01)
- H04L 25/49 (2006.01)

(52) U.S. Cl. .................. 455/114.3; 455/341; 455/63.1; 330/151; 330/199; 375/297

(58) Field of Classification Search ............ 455/114.3, 455/127.1, 341, 340, 63, 501.1; 375/296, 375/297; 330/123, 95, 274, 185, 199, 254, 330/149, 151

See application file for complete search history.

(56) References Cited

U.S. PATENT DOCUMENTS

| | | | |
|---|---|---|---|
| 5,355,126 A * | 10/1994 | Nelson et al. | 340/7.25 |
| 5,491,454 A | 2/1996 | Matz | |
| 5,623,227 A * | 4/1997 | Everline et al. | 330/2 |
| 5,740,173 A | 4/1998 | Fiorini | |
| 5,770,971 A * | 6/1998 | McNicol | 330/52 |
| 5,831,478 A * | 11/1998 | Long | 330/52 |
| 6,049,527 A | 4/2000 | Isoyama et al. | |
| 6,066,984 A * | 5/2000 | Tomaru et al. | 330/149 |
| 6,091,709 A | 7/2000 | Harrison et al. | |
| 6,140,874 A * | 10/2000 | French et al. | 330/149 |
| 6,198,346 B1 * | 3/2001 | Rice et al. | 330/52 |
| 6,556,076 B1 * | 4/2003 | Posner | 330/52 |
| 6,763,226 B1 | 7/2004 | McZeal, Jr. | |
| 6,785,342 B1 * | 8/2004 | Isaksen et al. | 375/284 |
| 6,804,246 B1 | 10/2004 | Petersen et al. | |
| 6,882,221 B2 * | 4/2005 | Schreyer et al. | 330/149 |
| 6,958,647 B2 * | 10/2005 | Rabinovich et al. | 330/52 |
| 7,333,561 B2 * | 2/2008 | Pinckley et al. | 375/297 |
| 2001/0015673 A1 * | 8/2001 | Yamashita et al. | 330/52 |
| 2002/0079964 A1 * | 6/2002 | Miyatani | 330/149 |
| 2002/0142797 A1 | 10/2002 | Tarighi et al. | |
| 2003/0184371 A1 | 10/2003 | Anderson et al. | |
| 2004/0152433 A1 * | 8/2004 | Braithwaite | 455/194.2 |
| 2005/0040887 A1 * | 2/2005 | Zappala | 330/149 |
| 2007/0013444 A1 * | 1/2007 | Porco et al. | 330/149 |

* cited by examiner

*Primary Examiner*—Nay A Maung
*Assistant Examiner*—Andrew Wendell

(57) ABSTRACT

A power amplifier has a non-linear low power pre-distortion amplifier (112) for transforming a carrier signal (111) to a pre-distorted signal (113) having a carrier component with out-of-phase non-linear distortions, and a non-linear power amplifier (114) having non-linear characteristics similar to a portion of the non-linear low power pre-distortion amplifier for generating from the pre-distorted signal a transmission signal (115) having an amplified carrier component with substantially diminished non-linear distortions.

8 Claims, 3 Drawing Sheets

200

300

APPARATUS FOR REMOVING DISTORTIONS CREATED BY AN AMPLIFIER

FIELD OF THE INVENTION

This invention relates generally to power amplifiers, and more particularly to an apparatus for removing or substantially diminishing distortions created by an amplifier.

BACKGROUND OF THE INVENTION

Complex modulation schemes and systems used in today's telecommunication infrastructure require a specified amount of spectral performance from a base station. In order to meet these spectral requirements numerous schemes are used to linearize the performance of power amplifiers within the base stations. Unfortunately, known schemes fail to provide significant correction for large bandwidths at a reasonable cost and efficiency.

SUMMARY OF THE INVENTION

Embodiments in accordance with the invention provide an apparatus for removing or substantially diminishing distortions created by an amplifier.

In a first embodiment of the present invention, a power amplifier has a non-linear low power pre-distortion amplifier for transforming a carrier signal to a pre-distorted signal having a carrier component with out-of-phase non-linear distortions, and a non-linear power amplifier having non-linear characteristics similar to the non-linear low power pre-distortion amplifier for generating from the pre-distorted signal a transmission signal having an amplified carrier component with substantially diminished non-linear distortions.

In a second embodiment of the present invention, a base station has a receiver for receiving signals from a selective call radio (SCR), a transmitter for generating a transmission signal directed to the SCR, and a processor for controlling operations of the receiver and the transmitter. The transmitter has an up-converter for transforming a signal at a first operating frequency to a carrier signal, a non-linear low power pre-distortion amplifier for transforming the carrier signal to a pre-distorted signal having a carrier component with out-of-phase non-linear distortions, and a non-linear power amplifier having non-linear characteristics similar to the non-linear low power pre-distortion amplifier for generating from the pre-distorted signal a transmission signal for radiating from an antenna, wherein the transmission signal has an amplified carrier component with substantially diminished non-linear distortions.

DETAILED DESCRIPTION

Figure 1:
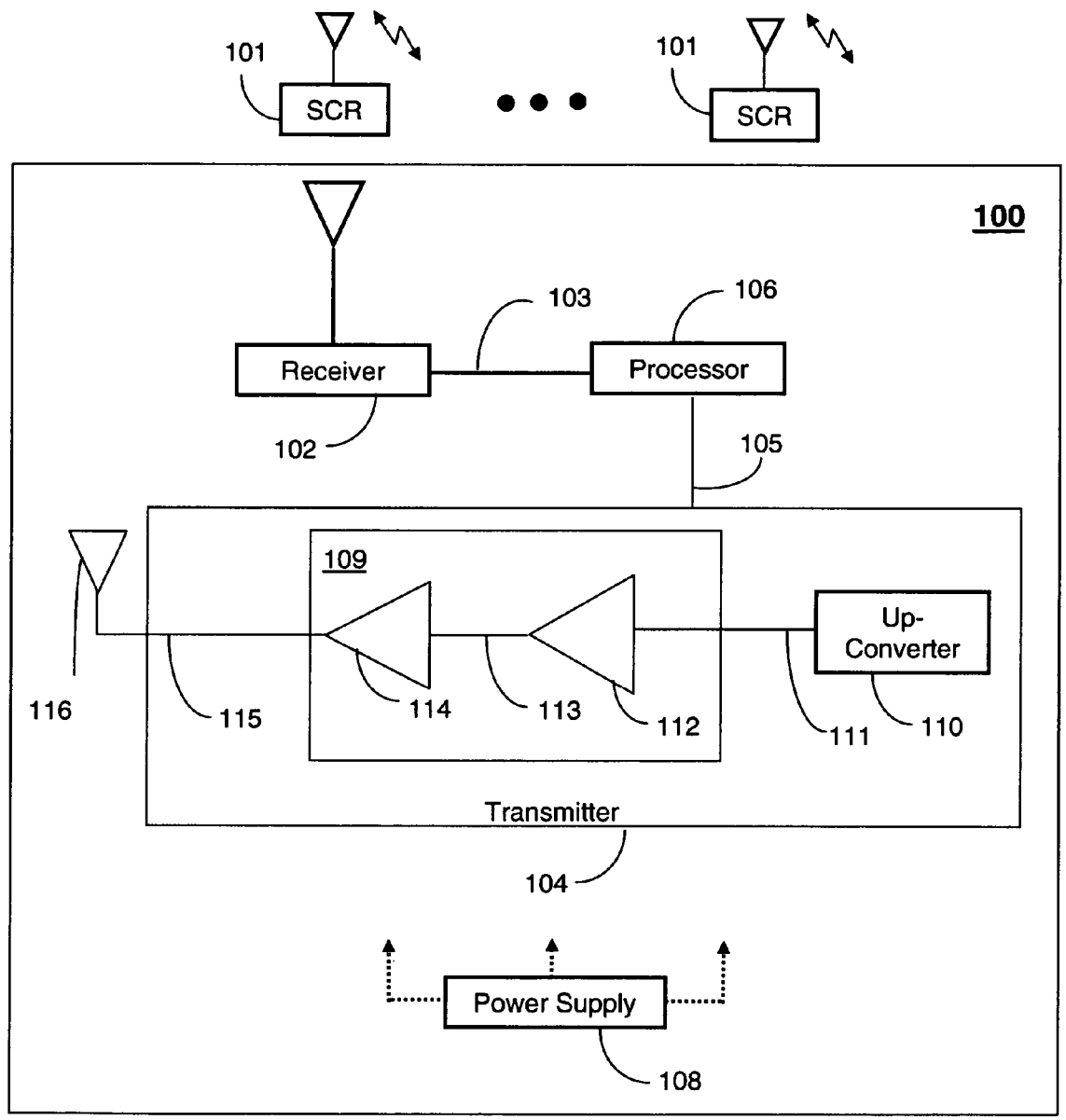
FIG. 1 is a block diagram of a base station in accordance with an embodiment of the present invention.

While the specification concludes with claims defining the features of embodiments of the invention that are regarded as novel, it is believed that the embodiments of the invention will be better understood from a consideration of the following description in conjunction with the figures, in which like reference numerals are carried forward.

FIG. 1 is a block diagram of a base station 100 in accordance with an embodiment of the present invention. The base station 100 comprises a conventional receiver 102 for supplying intercepted signals 103 from a selective call radio (SCR) 101, a transmitter 104 for generating a transmission signal 115 directed to the SCR 101 as a radiated signal, and a conventional processor 106 for controlling operations of the receiver 102 and the transmitter 104.

The transmitter 104 comprises a conventional up-converter 110 for transforming a signal 105 at a first operating frequency to a carrier signal 111 and an amplifier 109 for generating the transmission signal 115. Signal 105 can be a baseband signal generated by the processor 106 carrying therein a message intended to be processed by the SCR 101. Utilizing conventional technology, the up-converter 110 transforms the operating frequency of the signal 105 to a carrier signal 111 operating at a carrier frequency such as, for instance, 880 MHz (a typical cellular carrier band). A spectral representation of the carrier signal 111 is shown by way of example in FIGS. 2-3 at the input of the non-linear low power pre-distortion amplifier 112.

The amplifier 109 comprises a non-linear low power pre-distortion amplifier 112 and a non-linear power amplifier 114. The non-linear low power pre-distortion amplifier 112 transforms the carrier signal 111 to a pre-distorted signal 113 having a carrier component with out-of-phase non-linear distortions (see signal 113 in FIGS. 2-3). The non-linear power amplifier 114, having non-linear characteristics similar to the non-linear low power pre-distortion amplifier 112, in turn generates from the pre-distorted signal 113 the transmission signal 115 having an amplified carrier component with substantially diminished non-linear distortions (see signal 115 of FIGS. 2-3). The transmission signal 115 is radiated by a conventional antenna 116 for interception by the SCR 101.

The foregoing components of the base station 100 can be powered by a conventional power supply 108.

Figure 2:
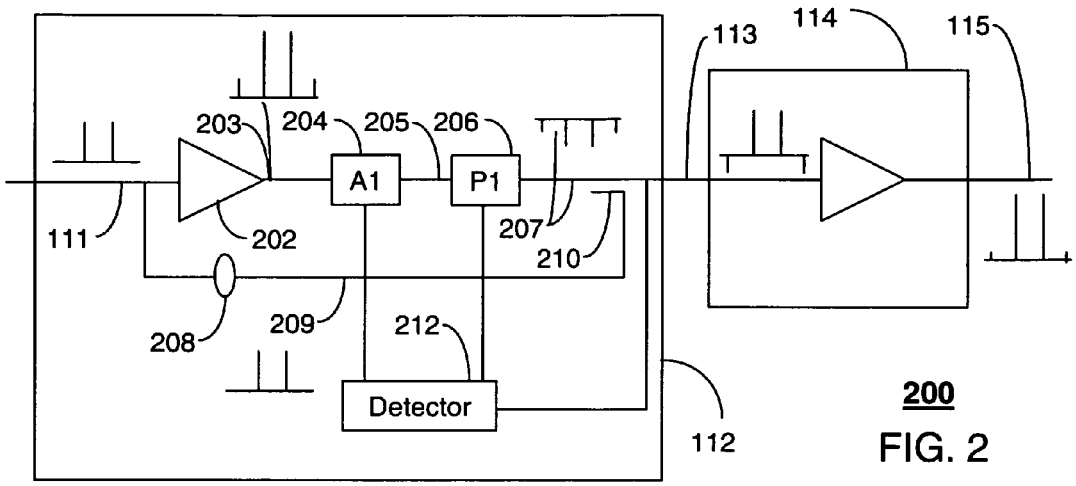
FIG. 2 is a block diagram of the non-linear low power pre-distortion amplifier of FIG. 1 in accordance with an embodiment of the present invention.
Figure 3:
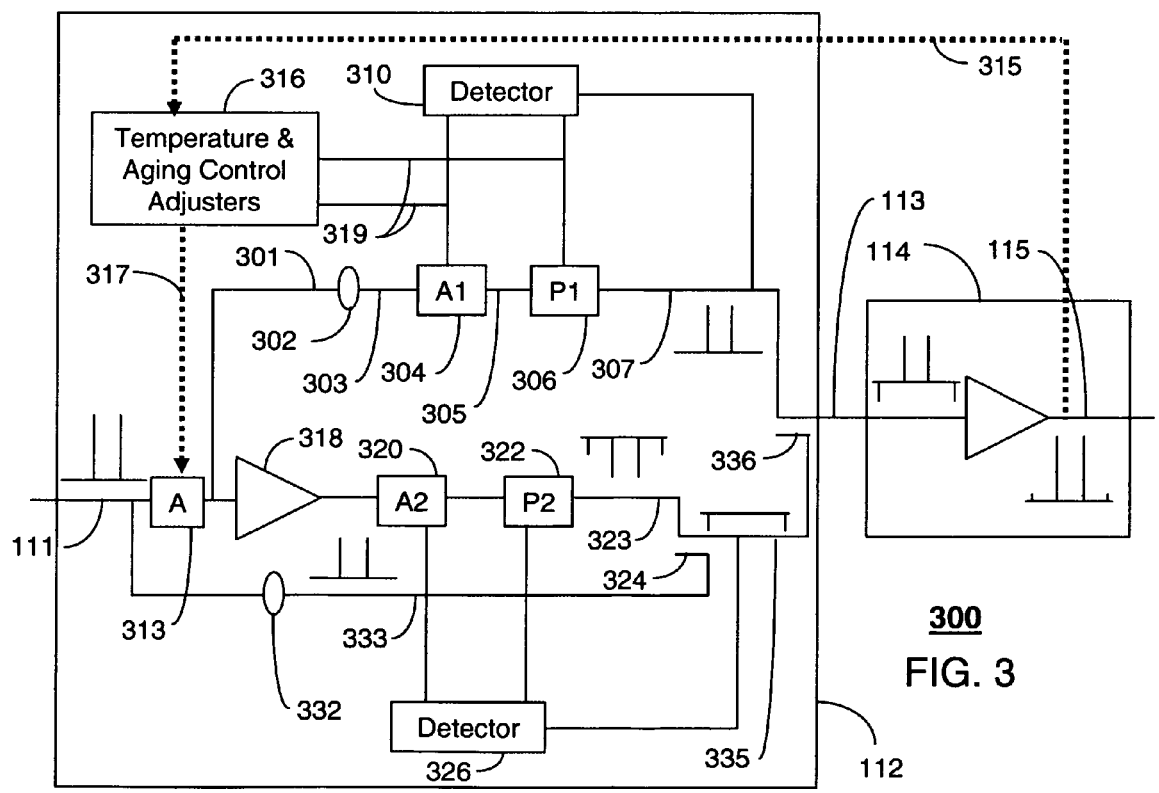
FIG. 3 is a block diagram of an alternate embodiment of the non-linear low power pre-distortion amplifier of FIG. 1 in accordance with an embodiment of the present invention.

FIGS. 2-3 are block diagrams of alternate embodiments 200 and 300 of the non-linear low power pre-distortion amplifier 112 in accordance with an embodiment of the present invention. In FIG. 2, the non-linear low power pre-distortion amplifier 112 comprises a non-linear low power amplifier 202 for generating from the carrier signal 111 a signal 203 having an amplified carrier component with non-linear distortions. A spectral representation is illustrated for signal 203. The outer signal bands in the spectral representation represent the non-linear distortions, while the central signal bands represent the amplified carrier component. It will be appreciated that depending on the spectral shape of the carrier signal 111 and non-linear characteristics of the non-linear low power pre-distortion amplifier 202 other spectral representations can result from the present invention. Accordingly, the spectral depictions of FIGS. 2-3 are for illustrating the operation of the present invention and are not to be considered limiting to the present scope and spirit of the claims described herein.

A portion (see amplifiers 202 and 318) of the non-linear low power amplifier 112 has similar if not identical non-linear characteristics as the non-linear power amplifier 114. The primary difference being that the non-linear power amplifier 114 provides a higher power capability than the non-linear low power amplifier 112. Notwithstanding structural and amplitude differences, both amplifiers 202 and 114 inject the same or very similar non-linear distortions shown in signal 203. Amplifiers 114, 202 (and amplifier 318 of FIG. 3) can utilize any conventional amplification technology such as, for example, LDMOS (Laterally-Diffused Metal Oxide Semiconductor) with parallel or single stage amplification structures.

A conventional attenuator 204 is coupled to the non-linear low power amplifier 202 for generating a signal 205 having an attenuated amplified carrier component with attenuated non-linear distortions. The attenuator 204 is designed to attenuate amplified carrier component so that it has lower amplitude than the carrier signal 209. A conventional phase shifter 206 is coupled to the attenuator 204 for generating a phase-shifted signal 207 having an out-of-phase attenuated carrier component with out-of-phase attenuated non-linear distortions as shown spectrally for signal 207. Signal 207 is phase shifted such that the carrier portion of 207 is at or nearly 180 degrees out of phase with the carrier signal 209.

Consequently, when signals 207 and 209 are combined by a conventional combining point 210 (such as a coupler or combiner), a pre-distorted signal 113 is generated having a carrier component with out-of-phase non-linear distortions as shown in the spectral representation illustrated above signal 113. The carrier component of the pre-distorted signal 113 results from the carrier signal 209 having a higher amplitude than the attenuated carrier component of signal 207 as noted earlier. In a supplemental embodiment, a delay element 208 can be added to signal path 209 to match the delay of the non-linear low power amplifier 202, the attenuator 204 and phase shifter 206, thereby better aligning the carrier portion of signals 207 and 209.

The high power amplifier 114 injects in the pre-distorted signal 113 in-phase non-linear distortions. As a result, the non-linear distortions are substantially diminished if not eliminated altogether, while the carrier component is amplified at a desired level as shown in the spectral representation of the transmission signal 115.

Although the attenuator 204 and phase shifter 206 can be in a first embodiment of the present invention fixed unalterable devices, alternatively said devices can be adjustable for more accuracy. For example, a detector 212 can be employed that utilizes conventional technology to monitor changes in amplitude and phase in the pre-distorted signal 113. The detector 212 can be designed to control the gain and phase of the attenuator 204 and phase shifter 206, respectively, to produce desired characteristics in the pre-distorted signal 113. It should also be noted that since variations in amplitude and phase of the non-linear low power amplifier 202 and the non-linear power amplifier 114 track with temperature and aging, there is no need to employ temperature and aging adjustment circuitry on the attenuator 204 and phase shifter 206.

FIG. 3 is a block diagram of an alternate embodiment 300 of the non-linear low power pre-distortion amplifier 112 in accordance with the present invention. In this embodiment, the non-linear low power pre-distortion amplifier 112 comprises a conventional first delay element 302 for generating a first delayed carrier signal 303. A first attenuator 304 generates an attenuated carrier signal 305 from the first delayed carrier signal 303. A first phase shifter 306 generates a phase-shifted carrier signal 307 from the attenuated carrier signal 305. A spectral representation of the resultant signal 307 is shown. Similar to embodiment 200, a first detector 310 utilizing conventional amplitude and phase detection circuitry is used for measuring amplitude in signal 307, thereby controlling the gain and phase of the first attenuator 304 and the first phase shifter 306, respectively, according to characteristics desired in the phase-shifted carrier signal 307.

At a circuit branch below, a non-linear low power amplifier 318, second attenuator 320 and second phase shifter 322 together generate from signal 301 a phase shifted signal 323 having a spectral representation similar to what was illustrated in the prior embodiment of the non-linear low power pre-distortion amplifier 112 at signal 207. A second delay element 332 generates a second delayed carrier signal 333, which is combined with the phase shifted signal 323 by a conventional first combining point 324, thereby generating a distortion signal 335 having out-of-phase attenuated non-linear distortions.

There is little or no carrier component in the distortion signal 335 as a result of a canceling effect attributed to the carrier component of the phase shifted signal 323 and the second delayed carrier signal 333 being out of phase with each other and having the same or nearly the same amplitudes. In a supplemental embodiment, this alignment can be accomplished by way of a second detector 326 utilizing conventional amplitude and phase detection circuits for measuring amplitude in signal 335, thereby controlling the gain and phase of the second attenuator 320 and the second phase shifter 322, respectively, according to spectral characteristics desired in the distortion signal 335.

A second combining point 336 is utilized for combining the phase-shifted carrier signal 307 and the distortion signal 335 thereby generating the pre-distorted signal 113. As in the previous embodiment, the pre-distorted signal 113 has a carrier component with out-of-phase non-linear distortions as shown in the spectral representation. Once again the high power amplifier 114 injects in the pre-distorted signal 113 in-phase non-linear distortions. The non-linear distortions are thus substantially diminished if not eliminated altogether, while the carrier component is amplified at a desired level as shown in the spectral representation of the transmission signal 115.

It should be noted that the first and second delay elements 302, 332 are designed to equalize time delays caused by the signal paths leading up to signals 307 and 335, thereby maximizing the amount of carrier cancellation at signal 335 and minimizing the distortion at 115.

In a supplemental embodiment, the non-linear low power pre-distortion amplifier 112 further includes first and second temperature and aging control adjusters 316 coupled to the first attenuator 304 and first phase shifter 306, respectively. The adjusters 316 perform the task of generating by conventional means bias signals that adjust variations in gain and phase in the non-linear power amplifier 114 as a function of temperature and aging. The temperature and aging control adjusters 316 can be selected from any one of a group of conventional circuits (not illustrated) such as a thermistor circuit, the processor 106 coupled to a digital-to-analog converter (DAC) and a temperature and aging sensor programmed for controlling operations thereof, and/or an amplitude modulation (AM) phase detector. Each of these circuits generates one or more bias signals characterized to track temperature and aging variations of the non-linear power amplifier 114.

For example, the AM detector (all portions of which are assumed to be included in block 316) can comprise an AM modulator for injecting into the carrier signal 111 an AM signal 317 by way of a conventional variable attenuator 313. A conventional AM detector detects AM signals embedded in the transmission signal 115. A first bandpass filter isolates a desired AM tone from the detected AM signals. A second bandpass filter is used for generating a filtered AM tone. A correlator coupled to the first and second bandpass filters generates signals 319 for adjusting gain in the first attenuator 304 and/or phase in the first phase shifter 306 to achieve a minimum amplitude of the detected AM tone.

Similarly, the non-linear power amplifier 114 can be characterized in a controllable temperature environment (e.g., a laboratory) from which amplitude and phase tables as a function of temperature and aging can be established. These tables can be programmed into the processor 106 for controlling the amplitude and phase of signal 307 by way of bias signals generated by the DAC supplied in signal 105 (in addition to the baseband signal) for producing desired characteristics in the phase shifted signal 307. A thermistor circuit can be designed to emulate a similar function. It will be appreciated that the base station 100 can be designed in an enclosure with a conventional temperature control system, thereby foregoing the need for the temperature and aging control adjusters 316.

Figure 4:
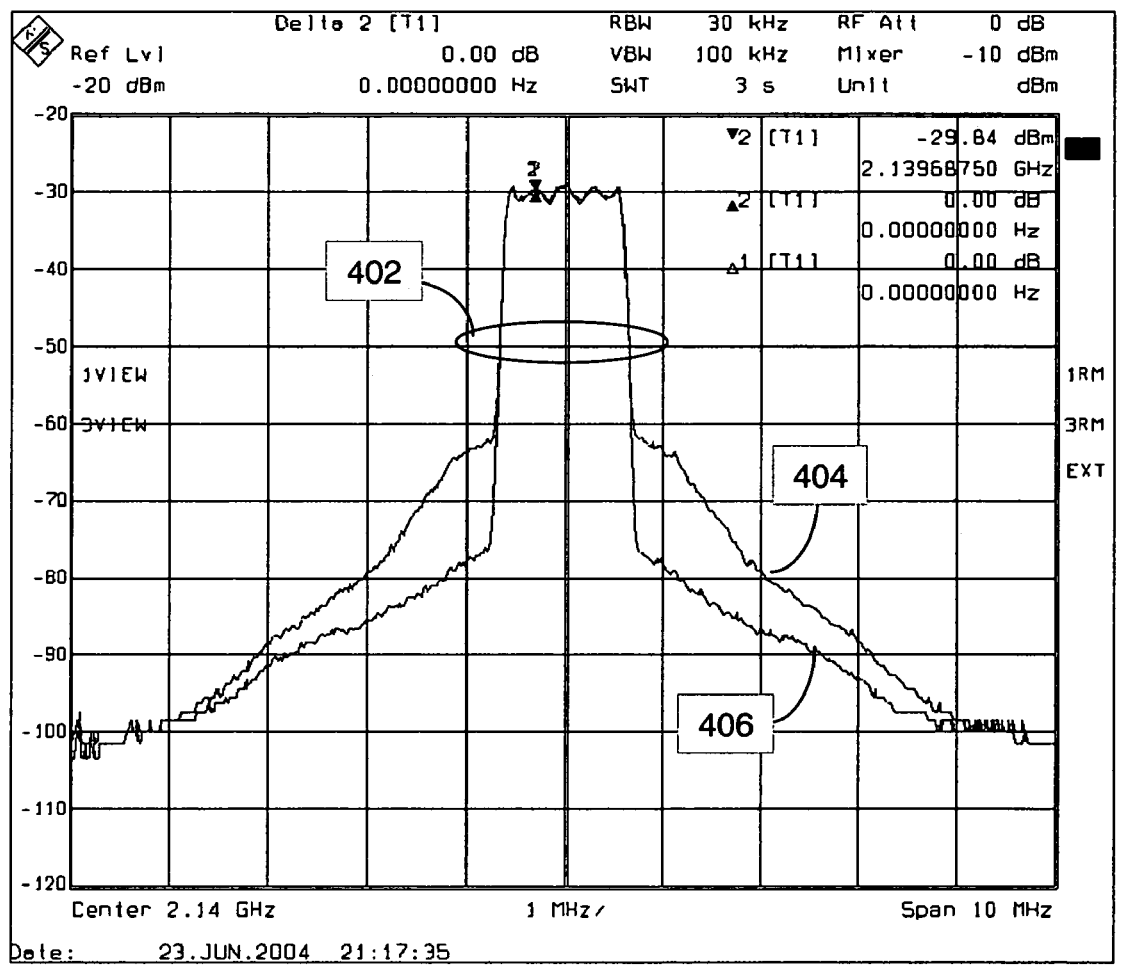
FIG. 4 depicts measurements of the transmission signal generated by the embodiment of FIG. 3 compared with a transmission signal from a prior art system.

FIG. 4 depicts measurements of the transmission signal 115 generated by embodiment 300 of FIG. 3 compared with a transmission signal from a prior art system. The spectral results show that the carrier signal 402 (single carrier in this example) is similar in both systems. However, the non-linear distortions 404 from an uncorrected system are substantially greater than the non-linear distortions 406 of embodiment 300 of FIG. 3.

It should also be noted that the foregoing embodiments 200-300 provide a wide range of power amplifications and correction bandwidth at low cost without manual re-tuning—a significant improvement over prior art systems. It should be evident to an artisan with skill in the art that portions of the present invention can be embedded in a computer program product, which comprises features enabling the implementation stated above. A computer program in the present context means any expression, in any language, code or notation, of a set of instructions intended to cause a system having an information processing capability to perform a particular function either directly or after either or both of the following: a) conversion to another language, code or notation; b) reproduction in a different material form. It should be also evident that the present invention may be used for many applications.

Thus, although the description is made for particular arrangements, the intent and concept of the invention is suitable and applicable to other arrangements and applications not described herein. For example, aspects of embodiments 200 and 300 can be combined and/or modified without departing from the scope and spirit of the claimed invention. For example, the delay elements described in FIGS. 2-3 can be removed. Additionally, one or more of the attenuators and phase shifters can be designed as fixed (i.e., unadjustable) elements without the need for amplitude and phase detectors. Phase shifting can be performed, for example, by way of varying trace lengths on a printed circuit board (PCB).

Any combinations of the aforementioned modifications as well as others not discussed are within the scope of the present invention. It would be clear therefore to those skilled in the art that modifications to the disclosed embodiments described herein could be effected without departing from the spirit and scope of the invention.

Accordingly, the described embodiments ought to be construed to be merely illustrative of some of the more prominent features and applications of the invention. It should also be understood that the claims are intended to cover the structures described herein as performing the recited function and not only structural equivalents. Therefore, equivalent structures that read on the description should also be construed to be inclusive of the scope of the invention as defined in the following claims. Thus, reference should be made to the following claims, rather than to the foregoing specification, as indicating the scope of the invention.

What is claimed is:

1. A power amplifier, comprising:
    a non-linear low power pre-distortion amplifier for transforming a carrier signal to a pre-distorted signal having a carrier component with out-of phase non-linear distortions wherein the non-linear low power pre-distortion amplifier comprises:
        a first delay element for generating a first delayed carrier signal;
        a first attenuator coupled to the first delay element for generating an attenuated carrier signal;
        a first phase shifter coupled to the carrier signal for generating a phase- shifted carrier signal from the attenuated carrier signal;
        a first detector for controlling gain and phase of the first attenuator and the first phase shifter, respectively, according to desired characteristics of the phase shifted carrier signal;
        a first temperature and aging control adjuster coupled ot the first phase shifter for generating a phase bias signal that adjusts variations in phase as a function of temperature and aging
        a non-linear low power amplifier for generating from the carrier signal an amplified carrier component with non-linear distortions;
        a second attenuator coupled to the non-linear low power amplifier for generating an attenuated amplified carrier component with attenuated non-linear distortions;
        a second phase shifter coupled to the second attenuator for generating a phase-shifted signal having an out-of-phase attenuated carrier component with out-of phase attenuated non-linear distortions; and
        a second delay element for generating a second delayed carrier signal;
        a first combining point for combining the phase-shifted signal and the carrier signal, thereby generating a distortion signal having the out-of phase attenuated non-linear distortions, wherein the distortion signal generated from the combining the phase-shifted signal with the second delayed carrier signal;
        a second detector for controlling gain and phase of the second attenuator and the second phase shifter, respectively, according ot characteristics desired in the distortion signal;
        a second temperature and aging control adjuster coupled to the first attenuator for generating a bias signal that adjusts variations in gain as a function of temperature and aging, and
        a second combining point for generating the pre-distorted signal by combining the phase-shifted carrier signal and the distortion signal; and
    a non-linear power amplifier having non-linear characteristics similar to a portion of the non-linear low power pre-distortion amplifier for generating from the pre-distorted signal a transmission signal having an amplified carrier component with substantially diminished non-linear distortions.

2. The power amplifier of claim 1, wherein the non-linear power amplifier comprises a plurality of parallel non-linear power amplifiers.

3. The power amplifier of claim 1, further comprising a delay element for generating a delayed carrier signal, wherein the first combining point generates the distortion signal from combining the phase-shifted signal with the delayed carrier signal.

4. The power amplifier of claim 1, wherein the first and second temperature and aging control adjusters are selected from one among a group of circuits comprising a thermistor circuit, a processor coupled to a digital-to-analog converter (DAC) and a temperature and aging sensor for controlling operations thereof, and an amplitude modulation (AM) detector, each of said circuits generates one or more bias signals characterized to track temperature and aging variations of the non-linear power amplifier.

5. The power amplifier of claim 1, wherein the AM detector comprises:
- an AM modulator for injecting into the transmission signal an AM tone;
- an AM detector for detecting AM signals embedded in the transmission signal;
- a first bandbpass filter for isolating a desired AM tone from the AM signals;
- a second bandpass filter generates from the AM tone a filtered AM tone; and
- a correlator coupled to the first and second bandpass filters for generating a signal corresponding to the amplitude of the detected AM tone.

6. A base station, comprising:
- a receiver for receiving signals from a selective call radio (SCR);
- a transmitter for generating a transmission signal directed to the SCR; and
- a processor for controlling operations of the receiver and the transmitter, wherein the transmitter comprises:
  - an up-converter for transforming a signal at a first operating frequency to a carrier signal;
  - a non-linear low power pre-distortion amplifier for transforming the carrier signal to a pre-distorted signal having a carrier component with out-of-phase non-linear distortions wherein the non-linear low power pre-distortion amplifier comprises:
    - a first delay element for generating a first delayed carrier signal;
    - a first attenuator coupled to the first delay element for generating an attenuated carrier signal;
    - a first phase shifter coupled to the carrier signal for generating a phase-shifted carrier signal from the attenuated carrier signal;
    - a first detector for controlling gain and phase of the first attenuator and the first phase shifter, respectively, according to desired characteristics of the phase shifted carrier signal;
    - a first temperature and aging control adjuster coupled ot the first phase shifter for generating a phase bias signal that adjusts variations in phase as a function of temperature and aging
    - a non-linear low power amplifier for generating from the carrier signal an amplified carrier component with non-linear distortions;
    - a second attenuator coupled to the non-linear low power amplifier for generating an attenuated amplified carrier component with attenuated non-linear distortions;
    - a second phase shifter coupled to the second attenuator for generating a phase-shifted signal having an out-of-phase attenuated carrier component with out-of-phase attenuated non-linear distortions; and
    - a second delay element for generating a second delayed carrier signal;
    - a first combining point for combining the phase-shifted signal and the carrier signal, thereby generating a distortion signal having the out-of-phase attenuated non-linear distortions, wherein the distortion signal generated from the combining the phase-shifted signal with the second delayed carrier signal;
    - a second detector for controlling gain and phase of the second attenuator and the second phase shifter, respectively, according ot characteristics desired in the distortion signal;
    - a second temperature and aging control adjuster coupled to the first attenuator for generating a bias signal that adjusts variations in gain as a function of temperature and aging, and
    - a second combining point for generating the pre-distorted signal by combining the phase-shifted carrier signal and the distortion signal; and
  - a non-linear power amplifier having non-linear characteristics similar to a portion of the non-linear low power pre-distortion amplifier for generating from the pre-distorted signal a transmission signal for radiating from an antenna, wherein the transmission signal has an amplified carrier component with substantially diminished non-linear distortions.

7. The base station of claim 6 wherein the first and second temperature and aging control adjusters are selected from one among a group of circuits comprising a thermistor circuit, the processor coupled to a digital-to-analog converter (DAC) and a temperature and aging sensor for controlling operations thereof, and an amplitude modulation (AM) detector, each of said circuits generates one or more bias signals characterized to track temperature and aging variations of the non-linear power amplifier.

8. The base station of claim 6, wherein the non-linear power amplifier comprises a plurality of parallel non-linear power amplifiers.

* * * * *